US008349474B2

(12) United States Patent
Morstein et al.

(10) Patent No.: US 8,349,474 B2
(45) Date of Patent: Jan. 8, 2013

(54) HOB CUTTER WITH A COATING AND METHOD FOR COATING HOB CUTTER

(75) Inventors: Marcus Morstein, Grenchen (CH); Tibor Cselle, Grenchen (CH); Andreas Lumkemann, Grenchen (CH); Jorn Kohlscheen, Schwarzenbek (DE)

(73) Assignee: Fette GmbH, Schwarzenbek (DE)

( * ) Notice: Subject to any disclaimer, the term of this patent is extended or adjusted under 35 U.S.C. 154(b) by 433 days.

(21) Appl. No.: 12/543,050

(22) Filed: Aug. 18, 2009

(65) Prior Publication Data

US 2010/0062257 A1    Mar. 11, 2010

(30) Foreign Application Priority Data

Sep. 5, 2008  (EP) ..................................... 08015741

(51) Int. Cl.
*B32B 9/00*  (2006.01)
(52) U.S. Cl. ............ 428/697; 51/307; 51/309; 428/216; 428/408; 428/698; 428/699
(58) Field of Classification Search ............ 51/307, 51/309; 428/212, 216, 408, 697, 698, 699, 428/7, 701, 702
See application file for complete search history.

(56) References Cited

U.S. PATENT DOCUMENTS 6,730,392 B2 *  5/2004  Vetter et al. ................... 428/699

(Continued)

FOREIGN PATENT DOCUMENTS

EP    1 357 577 B1    4/2002

(Continued)

OTHER PUBLICATIONS

"(Cr:A1)N-coatings deposited by the cathodic vacuum arc evaporation" by J. Vetter et al, in Surface and Coatings Technology 98 (1998) 1233-1239.

*Primary Examiner* — Archene Turner
(74) *Attorney, Agent, or Firm* — Vidas, Arrett & Steinkraus, P.A.

(57) ABSTRACT

The invention relates to a hob cutter tool with a coating, wherein the coating is produced by a physical vapor deposition method, in which in a coating chamber in an atmosphere containing nitrogen, an arc discharge is generated in each case between at least one anode and at least one pure Al cathode on the one hand, and at least one pure Cr cathode on the other hand, and in this way, Al and Cr are vaporized from the cathode, in which the hob cutter tool to be coated is rotated in the coating chamber, wherein the tool is subsequently guided past the at least two cathodes, and in which the vaporized Al and Cr is deposited in atomic or ionized form together with nitrogen from the atmosphere containing nitrogen onto the hob cutter tool led rotating past the cathodes. The coating has a multiplicity of layers, composed of (AlCr)-nitride, arranged on top of each other, wherein the multiplicity of layers is formed from two layer types differing with respect to their Al:Cr ratio, wherein a first layer type has an Al:Cr ratio in the range of 55:45 to 65:35, and a second layer type has an Al:Cr ratio in the range of 70:30 to 74:26, and wherein the two layer types alternate with each other in the coating, wherein each of the layers, in turn is formed from a multiplicity of nanolayers arranged on top of each other, and wherein the coating is connected to the tool base body using a bonding layer. Furthermore, the invention relates to a method for recoating such a hob cutter tool.

22 Claims, 3 Drawing Sheets

U.S. PATENT DOCUMENTS

| | | | |
|---|---|---|---|
| 6,906,295 B2 * | 6/2005 | Ge | 428/697 |
| 7,537,822 B2 * | 5/2009 | Ishikawa | 428/697 |
| 7,727,621 B2 * | 6/2010 | Nordlof et al. | 428/699 |
| 7,749,594 B2 * | 7/2010 | Åstrand et al. | 428/336 |
| 7,939,181 B2 * | 5/2011 | Ramm et al. | 428/701 |
| 7,947,363 B2 * | 5/2011 | Xu et al. | 428/698 |
| 7,960,016 B2 * | 6/2011 | Lechthaler et al. | 428/216 |
| 8,043,728 B2 * | 10/2011 | Yamamoto | 428/697 |

FOREIGN PATENT DOCUMENTS

| | | | |
|---|---|---|---|
| JP | 2003-340608 | * | 12/2003 |
| JP | 2004-106108 | * | 4/2004 |
| WO | 02050864 A1 | | 7/2002 |
| WO | 2004059030 A2 | | 7/2004 |
| WO | 2005038077 A2 | | 4/2005 |
| WO | 2006/099754 A1 | | 9/2006 |
| WO | 2006102780 A1 | | 10/2006 |

* cited by examiner

HOB CUTTER WITH A COATING AND METHOD FOR COATING HOB CUTTER

CROSS-REFERENCE TO RELATED APPLICATIONS

Not applicable.

STATEMENT REGARDING FEDERALLY SPONSORED RESEARCH

Not applicable.

BACKGROUND OF THE INVENTION

The invention relates to a hob cutter with a coating and a method for coating a hob cutter. Milling cutters, for example hob cutter tools, are subjected in practice to high stresses. As a result, there is comparatively high wear. Hob cutter tools, in particular, are subject to strong strike or impact stresses during operation.

It is known to provide such tools with a coating that is adapted to their application conditions, for example a hard coating. For this, physical vapor phase deposition (PVD) is used. For hobbing and for other cutting work, thus far, mainly single layer coatings, e.g., TiN, TiAlN or AlCrN coatings have been used. With such coatings, there is a constant chemical composition across the thickness. There is a conflict of goals in that on the one hand the hardest possible coatings are desired for the wear resistance, however, such hard layers can absorb mechanical stress peaks only to a small degree. Such peak stresses occur, for example, during process steps with discontinuous cuts. Through this, cracks can propagate through the tool coating, and lead to tool failure. From WO 2004/059030 A2, the entire contents of which is incorporated herein by reference, a workpiece with a hard coating containing AlCr, and a method for its production are known. There, so-called gradient layers can be provided with increasing Al content towards the surface. The layer composition can change continuously or step-wise over the layer thickness.

The known coatings have in common that they do not always possess optimal properties with regard to their wear resistance on the one hand, and their sensitivity to strike or impact stress on the other. The removal of swarf from a workpiece being processed represents another problem. For optimizing the removal of swarf, it is known, for example for arc PVD coatings to smooth the surface of the coating through finishing treatment. However, this represents an additional work step and gives rise to corresponding costs.

For the production of tool coatings, it is known from WO 2004/059030 A2, the entire contents of which is incorporated herein by reference, to vaporize the metallic portion of the hard coating from alloyed sources (so-called targets) with respectively constant compositions (e.g., Al:Cr compositions). However, due to the constant composition of the target, the flexibility with regard to the possible composition of layers that can be deposited is limited. With highly stressed tools, such as hob cutters, the coating loses its function due to wear after a certain service life. In order to avoid having to replace the entire tool in such a case, it is desired to renew just the coating, thus, to carry out a recoating. For this, at least parts of the tool surface that have worn out coating must be removed, for example, abraded. Subsequently, the tool can be recoated. However, the surface areas not removed in the process, have sometimes been subjected to very high temperatures in the prior use of the tool. Due to the change effected thereby of these areas, this leads to an at least partially insufficient adhesion of the new coating. This in turn, leads to the fact that the coating can fail during operation, for example, detach. Due to this problem also, the number of possible recoatings is limited.

Starting from the described state of the art, the objective of the invention is to provide a hob cutter tool and method of the initially named type, wherein the wear resistance on one hand, and the sensitivity against strike and impact stress on the other hand are improved in a manner that is simple to produce, and the ability to be recoated is improved.

BRIEF SUMMARY OF THE INVENTION

The invention solves the objective for a hob cutter tool with a coating in that the coating is produced by a physical vapor deposition method, in which in a coating chamber in an atmosphere containing nitrogen, in each case, an arc discharge is generated between at least one anode and at least one pure Al cathode on the one hand, and at least one pure Cr cathode on the other hand, and in this way, Al and Cr are vaporized from the cathodes, in which the hob cutter tool to be coated is rotated in the coating chamber, wherein the tool is subsequently guided past the at least two cathodes, and in which the vaporized Al and Cr is deposited in atomic or ionized form together with nitrogen from the atmosphere containing nitrogen onto the rotating hob cutter tool led past the cathodes. The coating has a multiplicity of layers, composed of (AlCr)-nitride, arranged on top of each other, wherein the multiplicity of layers is formed from two layer types differing with respect to their Al:Cr ratio, wherein a first layer type has an Al:Cr ratio in the range of 55:45 to 65:35, preferably 60:40 to 65:35, and a second layer type has an Al:Cr ratio in the range of 70:30 to 74:26, and wherein the two layer types alternate with each other in the coating. Each of the layers is, in turn, composed of a multiplicity of nanolayers arranged on top of each other, and the coating is bound to the tool base body using a bonding layer.

Thus, the invention proposes a multilayer alternating nitride hard layer construction for hob cutters. Through a variation of the Al:Cr ratio, with an appropriate control of the process parameters, alternating layers of differing hardness and with differing internal stresses are formed. Here, every other layer has the same Al:Cr composition. Thus, the coating is formed, for example, by layer compositions of the sequence A-B-A-B- . . . A-B.

Here, according to the invention, a physical vapor deposition method is used in which the tool to be coated is guided past at least two, in each case non-alloyed metal cathodes, in particular, repeatedly. For this purpose, the tool can be arranged, for example, on a plate, or similar, rotating in the coating chamber. The cathodes can, for example, be arranged in the center of the plate or on the side of the plate. Such a coating method and a corresponding coating apparatus, which are identified also as a round cathode method or round cathode apparatus, are disclosed in WO 02/050864 A1, EP 1 357 577 B1 or WO 05/038077 A2, the contents of these references are all incorporated herein by reference. Through the use of pure metal targets, in contrast to the use of alloy targets, a high flexibility exists with regard to the adjustment of the composition of the deposited material, e.g., through a suitable selection of the arc discharge generated in each case. Naturally, more than two pure metal targets can also be provided, for example, a chrome target combined with two or more aluminum targets.

Here, the coating chamber is usually evacuated (or partially evacuated). Usually, a (negative) voltage is also applied to the tool to be coated, so that the ions released from the cathode are transported by electromagnetic forces to the tool. The cathodes can be cylindrical and arranged next to each other, for example, wherein their cylindrical axes can be aligned vertically. The anode can be arranged in between the cathodes. Furthermore, in each case, a magnetic source (electromagnet and/or permanent magnet) can be provided in the cathodes, wherein the cathodes and the magnets assigned to them rotate relative to each other, in each case. There, it is conceivable, for example that the cathodes rotate, while the magnets are stationary. However, it is also conceivable that the magnets in the cathodes rotate, and the cathodes are stationary. Thus, the cathode material is vaporized uniformly because the rotating magnetic field guides the arc uniformly over the cathode surface. Customarily, a multiplicity of tools arranged on rotating tool holders or tool plates is coated in this process.

The nitrides according to the invention are formed by the addition of nitrogen from the gas phase. Naturally, along with nitrogen from the atmosphere in the coating chamber, other components can be deposited, for example, oxygen or carbon. The alternating Al:Cr ratios of the layers according to the invention are adjusted according to the invention, for example, through suitable adjustment of the arc discharge currents between the respective cathode and at least one anode. Here, first, the first layer is applied with the desired Al:Cr ratio, for example, by adjustment of appropriate arc currents between at least two cathodes and at least one anode. After the first layer was deposited with the desired composition and thickness, the Al:Cr ratio is changed, for example, in that the arc currents to the cathodes were changed correspondingly. Then, the second layer is deposited. After that, the composition selected again is as with that of the first layer, and the third layer is deposited, etc. until the coating of the tool according to the invention is built. In the process, it is particularly possible that the layer composition is provided with no additional metallic components along with the Al and Cr.

By successively guiding the tool past the cathodes in a suitable manner, nanolayers can be formed in an advantageous manner. The name nanolayers is derived from their thickness. In particular, they have a thickness in the range of a few nanometers. In the extreme case, they can consist of only a single layer of molecules or atoms. The number and thickness of the nanolayers per layer is controlled with the given dimensions of the cathodes and their arrangement in the coating chamber, for example, using the rotational speed of the tool.

Because, in each case, only one of the two metals aluminum or chrome is vaporized from the non-alloyed cathodes serving as the targets, more aluminum can be deposited onto the tool, in particular, during its pass past the Al-cathode, and more chrome can be deposited during its pass past the Cr-cathode. Thereby, the Al:Cr ratio within a single layer of the multilayer structure can be modulated in terms of nanolayers. In the process, the Al:Cr ratios of the nanolayers can be changed, in particular, periodically. Thus, due to the nanolayers, the Al:Cr ratio can vary even within the individual multilayers of the coating. The nanolayers can differ also in their crystal structure.

Averaged over the respective layer of the coating, the Al:Cr ratio according to the invention lies between 55:45 to 65:35 or 70:30 to 74:26, and it is the same for every second layer. It has been determined that a lower Al portion reduces the hardness of the individual layer and the heat insulating effect of the layers. On the other hand, a portion of Al that is too high can lead to undesired crystal structures. If the layers do not have any additional metallic components other than Al and Cr, the aluminum portion, relative only to the metallic components, for the first layer type lies between 55 and 65, and preferably between 60 and 65 atomic %, and the chrome portion lies between 45 and 35, preferably between 40 and 35 atomic %, or for the second layer type, the aluminum portion lies between 70 and 74 and the chrome portion between 30 and 26 atomic %. At the same time, more than 30 atomic %, for example, approximately 50 atomic % nitrogen, can be present in the overall composition of the coating.

A flexible adjustment of the coating is enabled through the combination according to the invention of layers with different hardness and different internal stresses, which are in turn built from individual nanolayers that also differ in their individual properties. Thus, through the combination according to the invention of a multiplicity of layers and nanolayers, on the one hand, a high resistance to abrasion, and thus, a higher wear resistance is attained through hard, although at the same time, brittle layers. On the other hand, through a high ductility of the relatively softer layers, a sufficient loading capacity for strike or impact stress, such as those that occur specifically with hob cutting, is guaranteed. Thereby the wear resistance of the hob cutter tool is increased, and in particular, the tendency of crack propagation in the coating or the separation of the coating is reduced.

Even with a softening of the substrate due to the introduction of heat during tool use (e.g., with tool steels), the coating according to the invention has a sufficient resistance to caving in while stressed due to discharging swarf (so-called egg shell effect). This is difficult to achieve with individual layers. In addition, the coating has a sufficient heat insulating effect and resistance to oxidation. This is guaranteed by the relatively high content of aluminum.

Furthermore, the coating according to the invention is connected to the tool base body, in particular, via a chemically different bonding layer. Such a bonding layer improves the adhesion of the coating and prevents a separation of the coating during operation. At the same time, the bonding layer leads to a shock absorbing effect in the case of impact stress of the tool. Metal nitrides that are free of Al are particularly suited for the bonding layer. According to the invention, it is disclosed that such layers can be created in a simple manner with the method used according to the invention, using pure metal cathodes. In contrast, if alloyed cathodes are used as targets, the creation of such bonding layers is not possible. The thickness of the bonding layer can be, for example, less than 1 μm.

According to the invention, it is disclosed that in particular (solid) steel or (solid) hard metal hob cutter tools can be provided with the coating according to the invention in an advantageous manner. Their strike or impact stress during operation can be increased in a particularly advantageous way, with a simultaneously higher wear resistance. The use of the coating according to the invention is conceivable especially for rotating tools, and there for machining methods with discontinuous cutting, in which particularly high stress peaks occur. Furthermore, the multilayer structure according to the invention offers advantages with the thermal interactions occurring with discontinuous cutting, in particular, when these effects are pronounced, as is the case during metal processing with cooling lubricants, e.g., emulsions.

A chrome nitride layer can be used as the bonding layer. In particular, no additional metal is added to the chrome nitride layer. Chrome nitride layers have proven particularly suited for the adhesion. At the same time, a chrome nitride layer can be created in a simple manner, in that chrome is vaporized from the pure Cr cathode in a nitrogen atmosphere, and together with the nitrogen is deposited on the tool base body, while the Al cathode is not used.

The thickness of the individual layers of the coating can lie, for example, in a range between 0.05 and 0.5 μm. According to one embodiment, the layers of the two layer types A and B of the coating can have different thicknesses. Thus, chemically different layers can have different thicknesses. Furthermore, according to the invention it is disclosed that the thickness of one or both layer types A and B can increase or decrease in a continuous or stepwise manner in the direction of the coating surface. In this way, a more flexible adjustment of the properties of the coating is possible.

According to an embodiment, the outermost layer of the coating can belong to the layer type with the greater Al portion (second layer type). Thus, the harder more wear-resistant layer, which comes in contact in the use of the tool with the workpiece to be processed, can be selected. However, it is also possible that the outermost layer of the coating belongs to the layer type with the lower Al portion (first layer type). In this case, the outermost layer belongs to the softer layer type that is less inclined to workpiece smearing. Correspondingly, the innermost layer of the coating can belong to the layer type with the lower Al portion (first layer type). Thus, the innermost layer has the lower Al portion, and is correspondingly more ductile. In this way, an especially resilient adhesion of the coating to the bonding layer or to the tool base body is attained.

According to a further embodiment, a friction reducing and/or different colored cover layer can be provided on top of the upper layer of the coating. The cover layer can have, for example, a thickness of 0.1 to 1 μm. Friction reducing in this context means that due to the composition and surface structure of the cover layer with, for example, metal swarf discharging on the cover layer, a lower frictional coefficient exists than would be the case with a discharge on the other layers of the coating. In this way, the removal of the swarf is optimized and there exists a lower tendency to adhere to the workpiece being processed. Damage due to swarf is avoided. By the cover layer having a different color, a particularly simple wear detection is guaranteed. A different color can be desired also for aesthetic reasons. The cover layer can be, for example, a carbon containing layer and/or a Me layer, wherein Me=Cr, Ti or Zr. Thus, for example, an AlMe-nitride layer can be used as a cover layer. As a carbon containing layer, for example MeNC (e.g., CrNC) or AlMeNC can be used. The carbon in the compounds reduces the frictional coefficient. In contrast to the state of the art, with use of the cover layer according to the invention, an additional smoothing of the coating surface is no longer necessary. The production is simplified. Through deactivating the metal target, for example, through switching off the arc currents supplying the metal targets, or a targeted covering of one or more metal cathodes by a suitable covering (shutter), an also metal-free hydrocarbon containing layer can be deposited, which is particularly friction resistant. The Me layer can also be a intermetallic layer, e.g. an AlMe layer, preferably an AlCr layer. This layer can, for example, be silver colored. Intermetallic compounds have a relatively high hardness and a low frictional coefficient. An MeNO layer (e.g., CrNO) is also conceivable as a cover layer.

For its production, the cover layer can in turn be applied through vapor deposition. The carbon element can be added, for example, in that at the end of the coating process in addition to the nitrogen atmosphere, a carbon containing gas in the desired quantity (e.g., methane, acetylene, etc.) is introduced into the coating chamber. Through arbitrary mixing ratios of nitrogen to carbon containing gas, a nearly arbitrary elemental composition C:N is attained. Metal-free hydrocarbon containing layers can be attained, for example, by switching off the metal sources during the vapor deposition. For producing a nitride-free metal cover layer, for example, of aluminum and another metal, the admittance of nitrogen into the chamber can correspondingly be interrupted during the coating.

The cover layer can have a graduated composition. A graduated composition is understood to mean that the chemical composition changes gradually or continuously over a region. Through realization, for example, of the transition between two material regions with a graduated composition, stress peaks can be avoided to a large degree. For production of the graduated composition, for example, the voltage applied for generating the arc between a metal target and the anode can be changed step-wise or continuously, or the quantity of the gas introduced into the coating chamber can be changed step-wise or continuously.

The layers (layer of the two layer types A and B and/or cover layer) can additionally have silicon, wherein the portion of silicon can amount to between 0.1 and 2.0 atomic % of the metallic components of the layers. Thus, in this case, the layers have, along with aluminum and chrome, silicon as an additional element. Relative to the metallic components of the layer (that is, in particular, without the nitrogen portion), thus, in this case, aluminum, chrome, and silicon, the silicon can have a portion of 0.1 to 5.0 atomic %. The addition of silicon leads to an additionally improved oxidation resistance and thermal insulation.

According to the invention, it is disclosed that the apparent conflict in goals with the production of hob cutter coatings can be solved particularly well by a high number of layers. Correspondingly, the coating according to the invention can have more than 10, preferably more than 30, further preferably more than 45 layers. If, for example, at least 60 layers are used for the coating, extensively optimized properties can be attained. The individual layers can, in turn, be built from more than 5, preferably more than 15, further preferably more than 25 nanolayers.

The layers of the coating can be present or deposited in the cubic crystal structure. The cubic crystal structure is characterized by a high hardness, and is preferred, for example, with respect to the softer hexagonal crystal structure. For the combination AlCr, the maximum Al portion for attaining the cubic crystal structure is approximately 72 atomic % relative to the metallic components.

Hob cutters have a sharp cutting edge for machining. According to a further embodiment of the invention, the cutting edges of the hob cutting tool can be rounded before the application of the coating. Such rounded cutting edges permit better coating. In particular, the adhesion of the coating or the bonding layer, as well as the mechanical stability of the coated cutting edges is improved.

The objective according to the invention is solved in addition by a method for recoating a hob cutting tool according to the invention, in which the tool surface to be coated again is at least partially removed, in particular, abraded, a Cr-nitride bonding layer is applied on the tool surface to be coated again, in that an arc discharge is generated in the nitrogen containing atmosphere only between the at least one anode and the at least one pure Cr cathode, and in this way, Cr is vaporized from the cathode, and in that the hob cutter tool rotates in the coating chamber, wherein it is guided at least past the Cr cathode, so that the vaporized Cr, together with nitrogen, condenses on the hob cutter tool. Then, a coating according to the invention is applied, also with the physical vapor deposition method, onto the Cr nitride bonding layer. Here, the physical vapor deposition method can be, in particular, the method with which the hob cutting tool was coated.

With the method, after the removal of the tool surface to be coated again and before the recoating, the cutting edges of the tool can be prepared, in particular, rounded, by a suitable method, especially wet or dry blasting. After the removal of the tool surface to be coated again or, if applicable, after a preparation of the cutting edges and before the recoating, the hob cutting tool can be cleaned.

According to the invention it is disclosed that through the use of pure metal cathodes the problems with the recoating arising in particular with hob cutting tools, can be solved in that only chrome is vaporized from the pure Cr-cathode, and together with the nitrogen from the gas phase is deposited as a Cr-nitride bonding layer on the at least partially removed surface of the tool. Such a Cr-nitride bonding layer cannot be applied with the customary alloyed targets. The bonding layer effects an improved binding of the coating also on the surface sections that are not removed, which otherwise, due to their surface changes created by the machining, are difficult to coat. Thereby, the number of possible recoatings is also increased. There, significantly more than half of the surface to be coated can be left, not removed. Through the removal, primarily oxidized surface regions are removed.

BRIEF DESCRIPTION OF THE SEVERAL VIEWS OF THE INVENTION

An exemplary embodiment of the invention is explained in the following in more detail using a drawing. They show schematically.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated.

Figure 1:
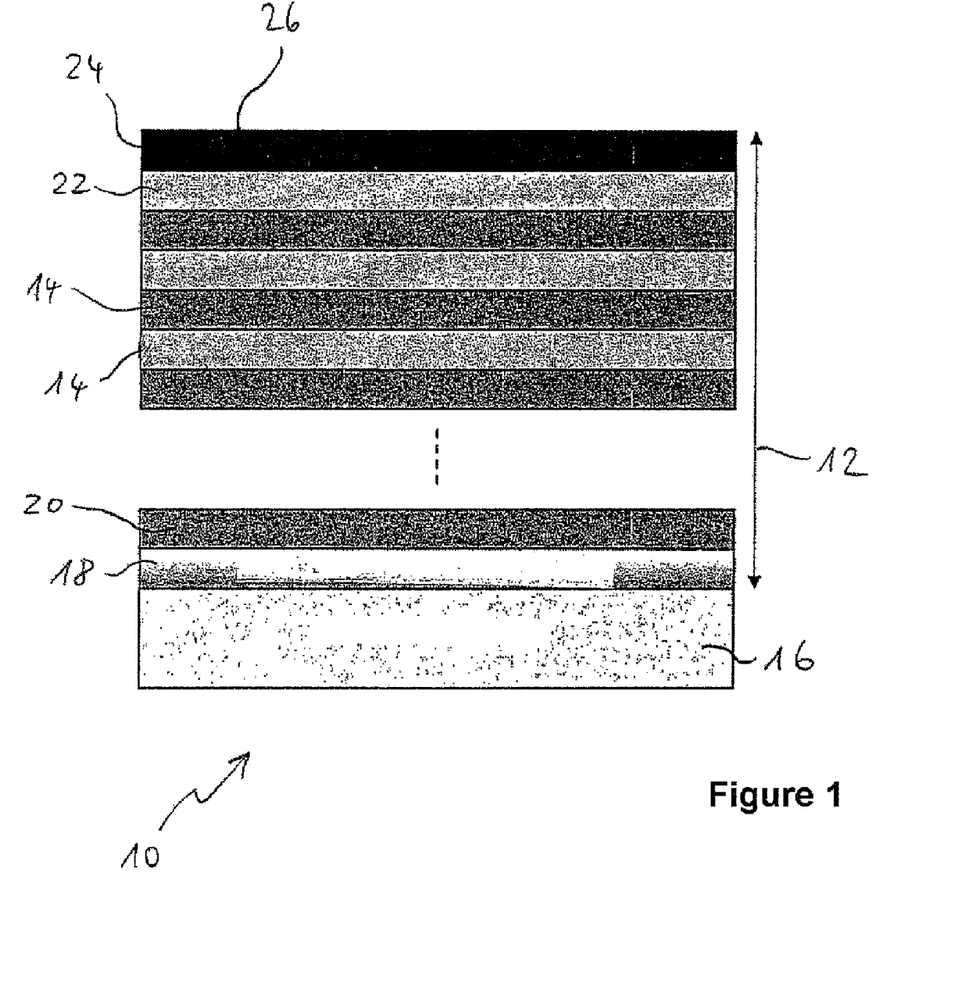
FIG. 1 a hob cutter tool according to the invention with a coating.

In FIG. 1, a hob cutter tool 10 according to the invention is represented schematically and in section. The hob cutter tool 10 has a coating 12 composed of a multiplicity of layers 14 arranged on top of each other. First, a bonding layer 18, here a CrN layer 18, is applied onto tool base body 16. The bonding layer 18 improves the adhesion of the remaining layers and at the same time has an impact absorbing effect. A first AlCr nitride layer 20 is applied onto the bonding layer 18. The first AlCr nitride layer is from a first layer type and has a first Al:Cr ratio in the range of 60:40 to 65:35. A second AlCr nitride layer, not represented more closely in FIG. 1, of a second layer type, which has a second different Al:Cr ratio in the range of 69.5:30.5 to 72:28, is applied onto the first layer 20. A third AlCr nitride layer 20, again of the first layer type, which is equal in its composition to the first AlCr nitride layer 20, is built onto the second AlCr nitride layer, and a fourth AlCr nitride layer 22 of the second layer type, which is equal in its composition to the second AlCr nitride layer, is built onto the third AlCr nitride layer 20. This construction continues across the coating 12. Each of the AlCr nitride layers is composed, in turn, from a multiplicity of nanolayers, not represented in more detail in FIG. 1, arranged on top of each other. The nanolayers can have, for example a thickness of less than 20 nm.

Table 1 shows typical properties of the layers according to the invention. The hardness values and the elastic modulus were obtained through nanohardness measurements with a test load of 30 to 70 mN. It can be seen that the AlCrN multilayers compared to the state of the art, in the form of monoblock or gradient layers developed specifically for the hob cutter, combine a very high hardness with a very high elastic modulus, which leads to the expectation of an improved wear resistance. The AlCrN multilayer variant Example 1, has according to the claim an average median Al content; Example 2 in comparison to Example 1, has a increased median Al content, and a reduced layer thickness of the individual layers.

TABLE 1

| Coating Type | H[GPa] | E[GPa] |
|---|---|---|
| Reference 1, AlCrSiN Gradient | 37.3 | 435 |
| Refenence 2, AlCrN Monoblock | 35.7 | 588 |
| AlCrN Multilayer Example 1 | 35.7 | 569 |
| AlCrN Multilayer Example 2 | 38.4 | 582 |

In the represented example, sixty layers 14 composed of AlCr nitrides are arranged on top of each other. In this, the two described layer types alternate in the construction of the coating. Each of the sixty layers 14 is composed in turn of more than 25 nanolayers. The AlCr nitride layers 20, 22 of the coating 12 are all present in the cubic crystal structure. A friction reducing and differently colored cover layer 24 is provided on top of the topmost layer 22 of the coating 12. In the represented example, the cover layer is a carbon containing layer 24. It reduces the friction during the machining of a workpiece with the hob cutter tool 10. In particular, it leads to an optimal swarf discharge from the tool surface 26.

The hob cutter tool 10 with the coating 12 according to the invention is produced by a physical vapor deposition (PVD), as described for example in WO 02/050864 A1, EP 1 357 577 B1 or WO 05/038077 A, the entire contents of these references are incorporated herein by reference. Here, different pure metal cathodes are arranged in a PVD coating chamber, not represented more closely; in the represented example cylindrical pure Al and Cr cathodes are arranged next to each other. By means of an arc discharge between at least one anode and the cathodes, Al and Cr can be released in a desired quantity from the respective cathode as a target. At the same time, nitrogen or a carbon containing gas can be introduced into the coating chamber. For producing the bonding layer 18, Cr only is released from the Cr cathode and nitrogen is introduced into the coating chamber. In the process, no aluminum is released from the Al cathode. For this, the Al cathode can be covered, for example, by means of a covering. Thus, a CrN layer is deposited onto the tool base body 16. Next, while maintaining the nitrogen atmosphere, Al and Cr are released from the pure Al and Cr targets by means of an arc discharge, so that an AlCr nitride layer is deposited onto the bonding layer 18. Here, the composition of this layer with regards to its AlCr ratio is selected by suitable arc currents to the Al and Cr targets. Subsequently, in an analogous manner, the second layer 22, which also is an AlCr nitride layer, with its AlCr composition, can be deposited onto the first layer 20, etc. If in addition, silicon is to be deposited, a cathode alloyed with silicon can also be provided in the coating chamber. For the concluding application of a, for example, carbon containing cover layer 24, a carbon containing gas, e.g., methane or acetylene, can be introduced into the coating chamber. The carbon is then deposited in the cover layer 24.

Different tools 10 according to the invention with coatings 12 according to the invention ("multilayer coatings") are compared regarding their tool life or their wear to tools with a conventional single layer AlCrN coating ("monolayer coating") under respectively equal operating conditions. In the following three examples, the conventional single layer coating has an Al:Cr ratio of 69:31. For the three examples, the corresponding test parameters are represented in the following three tables.

TABLE 2

| Tool: | Hob cutter |
| --- | --- |
| | PM-HSS |
| | Module 2.7 |
| Workpiece; | 20MnCrB5 |
| | soft |
| Processing: | dry |
| | $v_c$ = 220 m/min |
| | $f_a$ = 3.6 mm/TR |
| AlCrN multilayer coating variant 1: | |
| 60 layers | Al:Cr |
| 1st layer type: | 64:36 |
| 2nd layer type: | 70:30 |
| Cover layer | 70:30 |

TABLE 3

| Tool: | Hob cutter |
| --- | --- |
| | Hard metal K20 |
| | Module 2.7 |
| Workpiece: | 20MnCrB5 |
| | soft |
| Processing: | dry |
| | $v_c$ = 380 m/min |
| | $f_a$ = 3 mm/TR |
| AlCrN multilayer coating variant 1: | |
| 60 layers | Al:Cr |
| 1st layer type: | 64:36 |
| 2nd layer type: | 70:30 |
| Cover layer | 70:30 |

TABLE 4

| Tool: | Hob cutter |
| --- | --- |
| | PM-HSS |
| | Module 1.6 |
| Workpiece: | 16MnCr5 |
| | soft |
| Processing: | dry |
| | $v_c$ = 190 m/min |
| | $f_a$ = 2.1 mm/TR |
| AlCrN multilayer coating variant 2: | |
| 45 layers | Al:Cr |
| 1st layer type: | 60:40 |
| 2nd layer type: | 70:30 |
| Cover layer | 70:30 |

Here, hob cutters of different base materials with a coating according to the invention were tested during the processing of workpieces, in this case hob cutting, composed of different materials. In the represented examples, the workpieces being processed are gears. The processing is carried out dry in each case, thus, without the addition of cooling lubricant fluid. $v_c$ indicates the cutting speed in m/min and $f_a$ indicates the feed rate in mm/tool rotation (TR). The coatings (multilayer coatings) according to the invention were each built of a multiplicity of AlCrN layers (60 or 45 layers), wherein two layers, in each case differing with regard to their Al:Cr ratios, alternate in the coating. In the tested examples, the layers each have the same thickness. Each of the layers according to the invention was built, in turn, from a multiplicity of nanolayers. The coatings according to the invention were provided with an AlCrN cover layer, which respectively has an Al:Cr ratio of 70:30.

Figure 2:
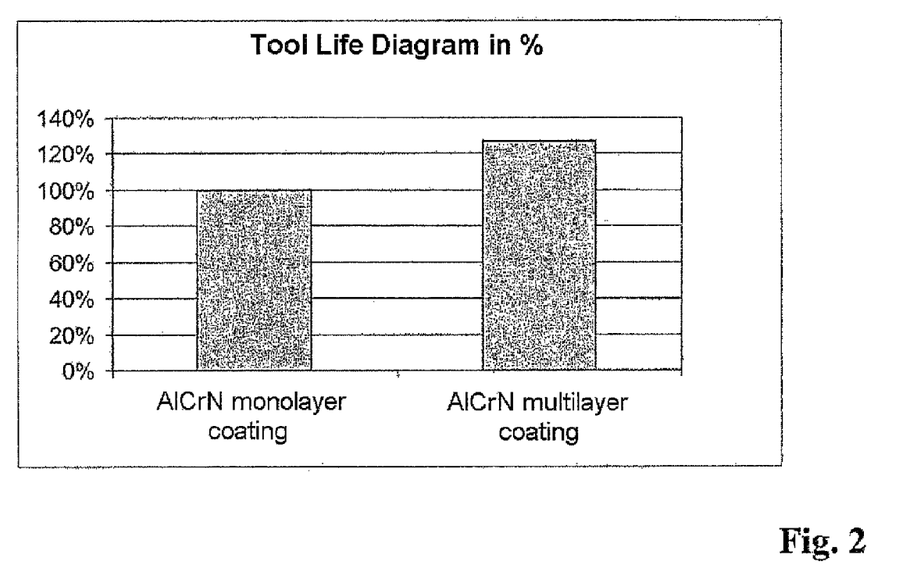
FIG. 2 a tool life bar chart according to a first example.
Figure 3:
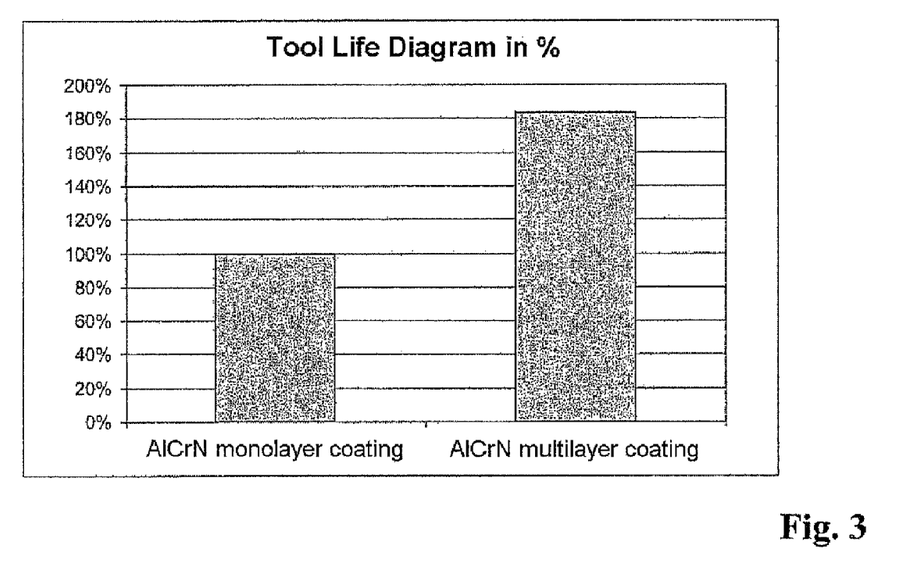
FIG. 3 a tool life bar chart according to a second example.
Figure 4:
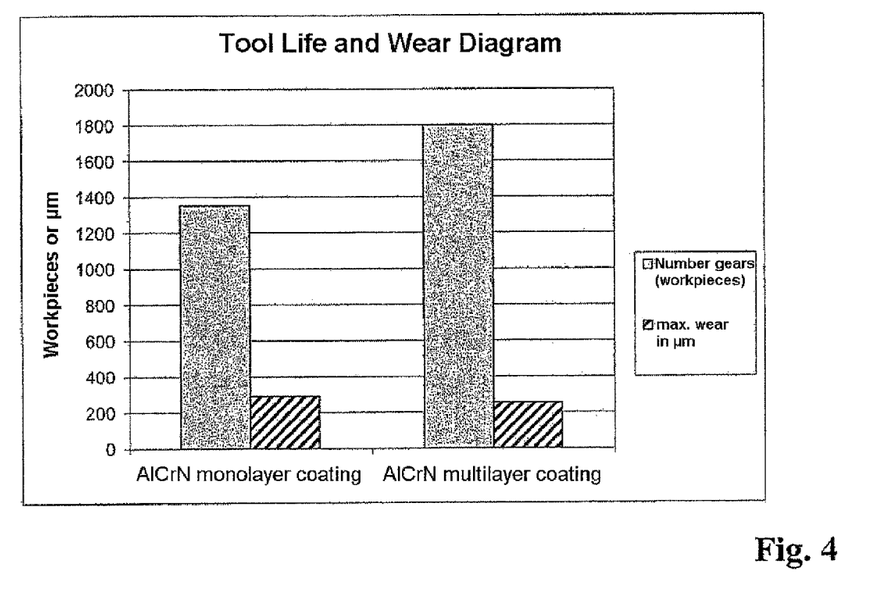
FIG. 4 a tool life and wear bar chart according to a third example.

The test results are shown diagrammatically in the FIGS. 2 to 4. In the FIGS. 2 and 3, each tool life diagram is represented in %, in which the tool life of the tools coated according to the invention ("AlCrN multilayer coating") were compared with the conventionally coated tools ("AlCrN monolayer coating"). Here, the tool life of the conventional tool was normalized in each ease to 100% for the comparison. It can be seen that the tools coated according to the invention have a significantly higher tool life under the same operating conditions compared to the conventional tools (approx. 130% or approximately 185%).

In FIG. 4 a tool life and wear diagram is represented. On the y axis, on the one hand, the maximum number of workpieces processed with the tools is plotted, and on the other hand, the maximum wear of the tools in μm occurring in the process, is plotted. The diagonally hatched bar shows the wear in μm for the conventional monolayer coating on the one hand, and for the multilayer coating according to the invention on the other hand. The two additional bars in FIG. 4 show the number of workpieces (gears) processed with the two tools being compared. It can be seen that with the conventionally coated tool, fewer than 1,400 workpieces could be processed, whereas with the tool coated according to the invention 1,800 workpieces could be processed. It can be seen further that the conventionally coated tool has a maximum wear of approximately 300 μm, whereas the tool coated according to the invention has a wear of approximately 250 μm.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed:

1. A hob cutter tool with a coating, wherein the coating (12) is produced through a physical vapor deposition method, in which in a coating chamber in a nitrogen containing atmosphere an arc discharge is generated in each case between at least one anode and at least one pure Al cathode on the one hand, and at least one pure Cr cathode on the other hand, and in this manner, Al and Cr are vaporized from the cathodes, in which the hob cutter tool (10) to be coated rotates in the coating chamber, wherein it is guided subsequently past the at least two cathodes, and in which the vaporized Al and Cr is deposited in atomic or ionic form together with nitrogen from the nitrogen containing atmosphere onto the rotating hob cutter tool (10) being guided past the cathodes, wherein the coating has a multiplicity of layers (14), composed of (AlCr)-nitride, arranged on top of each other, wherein the multiplicity of layers (14) is formed from two layer types (20, 22) differing with respect to their Al:Cr ratio, wherein a first layer type has an Al:Cr ratio in the range of 55:45 to 65:35, and a second layer type has an Al:Cr ratio in the range of 70:30 to 74:26, and wherein the two layer types (20, 22) alternate with each other in the coating (12), wherein each of the layers (14) in turn is formed from a multiplicity of nanolayers arranged on top of each other, and wherein the coating (12) is connected to the tool base body (16) via a bonding layer (18).

2. The hob cutter tool according to claim 1, characterized in that the bonding layer (18) is a chrome nitride layer.

3. The hob cutter tool according to claim 1, characterized in that the layers of the coating have a different thickness.

4. The hob cutter tool according to claim 3, characterized in that the thickness of the layers increases or decreases continuously or step-wise in the direction of the coating surface.

5. The hob cutter tool according to claim 1, characterized in that the outermost layer of the coating (12) belongs to the second layer type (20, 22).

6. The hob cutter tool according to claim 1, characterized in that the innermost layer of the coating (12) belongs to the first layer type (20, 22).

7. The hob cutter tool according to claim 1, characterized in that a friction reducing and/or differently colored cover layer (24) is provided on the outermost layer of the coating (12).

8. The hob cutter tool according to claim 1, characterized in that the cover layer (24) is a carbon containing layer (24) and/or a metallic layer.

9. The hob cutter tool according to claim 7, characterized in that the cover layer (24) has a graded composition.

10. The hob cutter tool according to claim 7, characterized in that the layers (14) additionally have silicon, wherein the portion of silicon amounts to between 0.1 and 2.0 atomic % of the metallic components of the layers (14).

11. The hob cutter tool according to claim 7, characterized in that the coating (12) has more than 10 layers (14).

12. The hob cutter tool according to claim 7, characterized in that the layers (14) of the coating (12) are present in the cubic crystal structure.

13. The hob cutter tool according to claim 7, characterized in that the cutting edges of the hob cutter tool (10) are rounded by a suitable method before the application of the coating (12).

14. The hob cutter tool according to claim 7, characterized in that the coating is produced using cylindrical, rotating arc PVD cathodes.

15. A method for recoating a hob cutter tool:
a) providing the hob cutter tool of claim 1;
b) the tool surface to be coated again is at least partially removed, in particular, abraded,
c) on the tool surface to be coated again, a Cr nitride bonding layer is applied using the physical vapor deposition method, in that an arc discharge is generated in a nitrogen containing atmosphere only between the at least one anode and the at least one pure Cr cathode, and in this manner Cr is vaporized from the cathode, and in that the hob cutter tool (10) rotates in the coating chamber, wherein it is guided at least past the Cr cathode, such that the vaporized Cr together with the nitrogen condense onto the hob cutter tool,
d) a coating (12) with a multiplicity of layers (14), composed of (AlCr) nitride, arranged on top of each other, is then applied onto the Cr nitride bonding layer, also using the physical vapor deposition method, wherein the plurality of layers (14) is formed from two layer types (20, 22) differing with respect to their Al:Cr ratios, wherein a first layer type has an Al:Cr ratio in the range of 60:40 to 65:35 and a second layer type has an Al:Cr ratio in the range of 69.5:30.5 to 72:28, and wherein the two layer types (20, 22) alternate with each other in the coating (12), wherein each of the layers (14) is formed from a multiplicity of nanolayers arranged on top of each other.

16. The method according to claim 15, characterized in that the coating is performed using cylindrical, rotating arc PVD cathodes.

17. The method according to claim 15, characterized in that after the removal of the tool surface to be coated again and before the recoating, the cutting edges of the hob cutter tool (10) are prepared, in particular, rounded, by a suitable method, especially wet or dry blasting.

18. The method according to claim 15, characterized in that the hob cutter tool (10) is cleaned after the removal of the tool surface to be coated again, or if applicable, after the preparation of the cutting edges and before the recoating.

19. The method according to claim 15, characterized in that a coating (12) is applied.

20. The hob cutter tool of claim 1, characterized in that the first layer type has an Al:Cr ratio in the range of 60:40 to 65:35.

21. The hob cutter tool of claim 11, characterized in that the coating (12) has more than 30 layers (14).

22. The hob cutter tool of claim 11, characterized in that the coating (12) has more than 45 layers (14).

* * * * *

UNITED STATES PATENT AND TRADEMARK OFFICE
CERTIFICATE OF CORRECTION

| | | |
|---|---|---|
| PATENT NO. | : 8,349,474 B2 | Page 1 of 1 |
| APPLICATION NO. | : 12/543050 | |
| DATED | : January 8, 2013 | |
| INVENTOR(S) | : Morstein et al. | |

It is certified that error appears in the above-identified patent and that said Letters Patent is hereby corrected as shown below:

On the Title Page, item (73) Assignee, under Fette GmbH, Schwarzenbek (DE), insert --Platit AG, Grenchen (CH)--.

Signed and Sealed this
Tenth Day of December, 2013

Margaret A. Focarino
*Commissioner for Patents of the United States Patent and Trademark Office*